(12) United States Patent
Wesseling et al.

(10) Patent No.: US 7,288,742 B2
(45) Date of Patent: Oct. 30, 2007

(54) METHOD AND DEVICE FOR HEATING A STRIP-SHAPED CARRIER

(75) Inventors: Wessel Joris Wesseling, Veldhoven (NL); Franciscus Johannes Sonnemans, Overijse (BE); Dionys Van De Ven, Eindhoven (NL)

(73) Assignee: Assembleon N.V., Veldhoven (NL)

( * ) Notice: Subject to any disclaimer, the term of this patent is extended or adjusted under 35 U.S.C. 154(b) by 0 days.

(21) Appl. No.: 11/520,040

(22) Filed: Sep. 13, 2006

(65) Prior Publication Data

US 2007/0075068 A1    Apr. 5, 2007

(51) Int. Cl.
*F27B 9/28*    (2006.01)
*F27B 9/36*    (2006.01)
*F27D 3/06*    (2006.01)
*B65G 25/00*    (2006.01)

(52) U.S. Cl. ............... 219/388; 228/180.21; 228/28; 432/8; 432/135; 198/689.1; 198/750.12

(58) Field of Classification Search ............ None
See application file for complete search history.

(56) References Cited

U.S. PATENT DOCUMENTS

| | | | |
|---|---|---|---|
| 3,689,991 A * | 9/1972 | Aird ............... | 228/180.21 |
| 4,050,618 A * | 9/1977 | Angelucci et al. ..... | 228/180.21 |
| 4,283,839 A * | 8/1981 | Gursky ............... | 228/180.21 |
| 4,657,170 A   | 4/1987 | Müller | |
| 5,582,753 A * | 12/1996 | Vos ............... | 219/388 |
| 5,656,115 A * | 8/1997 | Tanno et al. ......... | 156/270 |
| 5,729,896 A * | 3/1998 | Dalal et al. ............ | 228/180.22 |
| 6,216,848 B1* | 4/2001 | Zens ............... | 198/689.1 |

FOREIGN PATENT DOCUMENTS

| | | |
|---|---|---|
| DE | 101 62 327 A1 | 5/2003 |
| EP | 0 472 086 A2 | 2/1992 |
| EP | 0 658 081 A1 | 6/1995 |

* cited by examiner

*Primary Examiner*—Joseph M. Pelham
(74) *Attorney, Agent, or Firm*—Richard C. Peet; Foley & Lardner LLP

(57) ABSTRACT

According to a method and a device for heating a strip-shaped carrier in an oven, a carrier is passed through the oven in a direction of conveyance. The carrier is supported by a heatable plate, which together with the carrier is moved through the oven stepwise with a predetermined step size from a starting position to an end position.

14 Claims, 2 Drawing Sheets

METHOD AND DEVICE FOR HEATING A STRIP-SHAPED CARRIER

CROSS-REFERENCE TO RELATED APPLICATIONS

This application claims priority to, and hereby incorporates by reference in its entirety, The Netherlands Patent Application No. 1029954, which was filed on Sep. 14, 2005.

BACKGROUND

The invention relates to a method for heating a strip-shaped carrier in an oven. The invention also relates to a device provided with an oven for heating a strip-shaped carrier.

One such conventional method and device are disclosed in European Patent No. EP 0,658,081 in which a strip-shaped carrier provided with components is passed through an oven. The components are placed in a soldering compound on the carrier, which soldering compound is melted in the oven and subsequently solidifies, thereby fixing the components on the strip-shaped carrier. Both upstream and downstream of the oven, the strip-shaped carrier is placed in a loop so as to form buffers with devices placed upstream and downstream of the buffers. The buffers compensate for irregularities in the conveyance of the strip-shaped carrier through the oven. Also, during a malfunction the buffers make the oven move relative to the component placement device situated upstream of said oven. The oven is movable in order to prevent overheating of the strip-shaped carrier present in the oven. Switching off the conventional oven in the event of a malfunction is not considered a viable solution because the oven cools down slowly.

What is needed, therefore, is an apparatus and a methodology that may address at least one if not more of the deficiencies that afflict conventional practice, as previously described. For example, an object of the invention is to provide: (a) a method by means of which a strip-shaped carrier can be heated in an oven in a simple manner; and (b) a device by means of which a strip-shaped carrier is easy to heat.

SUMMARY

An embodiment of the invention is a method in which a carrier is supported by a heatable plate, which is moved together with the carrier, through an oven stepwise with a predetermined step size from a starting position to an end position, after which the carrier is moved further in the direction of conveyance, while the heatable plate is returned to the starting position. The stepwise movement of the heatable plate with a predetermined step size ensures that the heatable plate can be passed through the oven in a simple manner.

The heatable plate may efficiently heat the lower side of the carrier. Further, by way of the efficient heating of the lower side of the carrier, the upper side of the carrier and, for example, a soldering compound and components placed thereon may also be efficiently heated. If components are fixed on the carrier, the components may remain relatively cool while the carrier is being heated from the lower side.

According to another embodiment of the method according to the invention, the carrier may be drawn against the plate by means of vacuum. The vacuum may ensure that good heat transfer occurs between the heatable plate and the carrier.

According to another embodiment of the method according to the invention, a component placement device (by way of which components may be placed on the carrier) may be present upstream of the oven. After the components are provided on the carrier, the location of the components related to the carrier may be fixed in the oven. The component placement device may be provided with a movement mechanism by means of which the carrier may be moved through the component placement device stepwise with a predetermined step size. Further, the step size of the movement mechanism may be equal to the step size of the plate. In this way it is possible to move a carrier or carriers extending between the component placement device and the oven uniformly in the direction of conveyance, so that a loop-shaped buffer may not be necessary between the component placement device and the oven. Such a loop-shaped buffer may be undesirable in cases in which components are placed in a soldering compound on the carrier, as there otherwise may be a risk that the components move relative to the carrier.

Another embodiment of the invention is a device in which an oven may be provided with a heatable plate that can be moved stepwise with a predetermined step size from a starting position to an end position, after which the heatable plate may be returned to the starting position. The carrier can be heated up in a simple manner by means of the heatable plate. Furthermore, in the event of a malfunction, the heatable plate may be switched off, so that overheating of the carrier is prevented in a simple manner.

According to another embodiment of the device according to the invention, the plate may be provided with at least one aperture connected to a vacuum source. In this way, a vacuum can easily be created through the apertures, by means of which vacuum the carrier may be drawn against the plate in order to ensure good heat transfer.

According to another embodiment of the device according to the invention, each aperture may be connected to a corresponding pipe. In this way, a desired vacuum may be applied in a controlled manner to each aperture.

According to another embodiment of the device according to the invention, the apertures may be connected to a common vacuum chamber. By means of such a common vacuum chamber, a vacuum can be applied in a simple manner to all apertures. Further, means may be provided in the vacuum chamber to prevent the heated plate from bending.

According to another embodiment of the device according to the invention, the length of the plate in the direction of conveyance may be at least equal to the step size by which the plate is moved in the direction of conveyance, multiplied by the number of steps in which the plate is moved from the starting position to the end position. In this way, it is ensured that each part of the strip-shaped carrier comes into contact with the heatable plate at least once during the movement of the carrier through the oven, and is, therefore, heated.

According to another embodiment of the device according to the invention, the device may be provided with a component placement device situated upstream of the oven, which component placement device comprises a movement mechanism by means of which the carrier may be movable stepwise with a predetermined step size through the component placement device. The step size of the movement mechanism may be equal to the step size of the plate. By means of such a device, a carrier may be readily provided with components that may be affixed to the carrier in the oven.

These and other features, aspects, and advantages of the present invention will become more apparent from the following description, appended claims, and accompanying exemplary embodiments shown in the drawing.

DETAILED DESCRIPTION

Embodiments of the invention are illustrated in FIGS. 1-5. An effort has been made to use the same, or like, reference numbers throughout the drawings to refer to the same or like parts.

Figure 1:
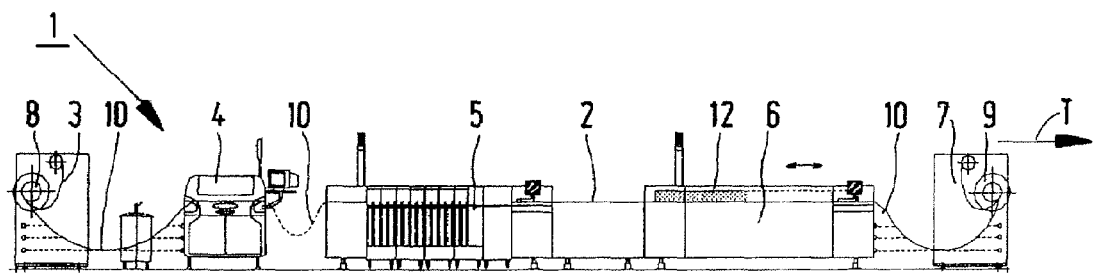
FIG. 1 is a front plan view of an embodiment of a device according to the present invention.
Figure 2:
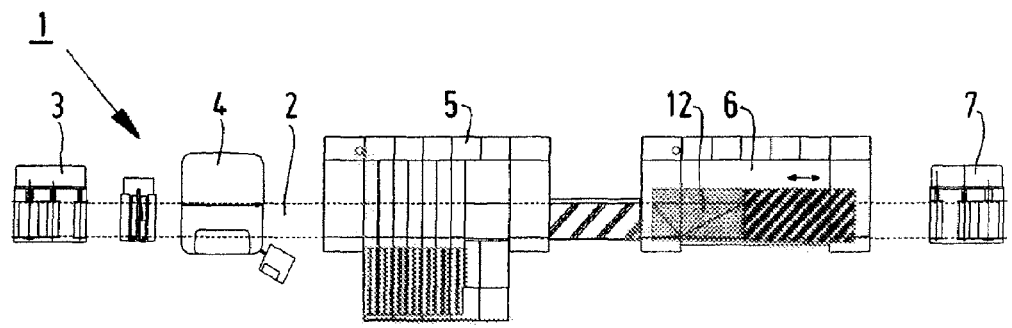
FIG. 2 is a top plan view of the device shown in FIG. 1.

FIG. 1 shows a device 1 for placing and fixing electronic components on a film (strip-shaped carrier) 2, for example of polyimide, which is provided with an electrically conducting pattern. The device 1 is provided with a film unwinding device 3, a stencil device 4, a component placement device 5, an oven 6, and a film winding device 7. The film 2 originally wound on a roll 8 is unwound and provided with soldering compound by means of a stencil in the stencil device 4. In the component placement device 5, the film 2 is then provided with components. Subsequently, the components are connected to the film 2 by a soldering compound that melts in the oven 6 and thereafter re-solidifies. Thereafter, the film 2, which is provided with components, is rolled onto a roll 9 in the film winding device 7. The film unwinding device 3, the stencil device 4, the component placement device 5, and the film winding device 7 are conventional devices.

Buffers may be formed between the various devices by means of loops 10 in the film 2, so that if there is a malfunction in one of the devices, the other devices can still continue to operate for a limited time before these devices also have to be stopped. The length of the loops is selected in such a way that the buffer does not empty when there is an average delay as the result of a typical malfunction. A loop-shaped buffer is undesirable between the component placement device 5 and the oven 6. The film 2 should extend tautly between the component placement device 5 and the oven 6 in order to prevent undesirable shifting of the accurately positioned components in the soldering compound.

The component placement device 5 is provided with a conventional movement mechanism 11 (schematically shown in FIG. 4) by means of which the film 2 is moved stepwise with a predetermined step size S1 in the direction of conveyance indicated by arrow T. The movement mechanism 11 moves stepwise from a starting position through intermediate positions to an end position in which it supports the film 2. Near the end position, the movement mechanism 11 is moved downwards, followed by being returned to the starting position in a direction opposite to that of the direction of conveyance T, followed by being moved upwards so that the movement mechanism 11 comes into contact with another part of the film 2, which is subsequently moved in the direction of conveyance T. As the movement mechanism 11 is conventional, it will not be discussed in any further detail.

The oven 6 is provided with a heatable plate 12 (FIG. 3), which is provided with an electric heating element. The heatable plate 12 is provided with a number of apertures 13, which on lower sides thereof are connected to pipes 14. The pipes 14 are connected on a side facing away from the apertures 13 to a common pipe 15, which is connected to a vacuum source (not shown).

The plate 12 is movable stepwise with a predetermined step size S2 (FIG. 4) in the direction of conveyance T and can also be moved backwards underneath the film 2 in the direction opposite to that of the direction of conveyance T. During the movement of the plate 12 in the direction of conveyance T, the film 2 is drawn against the plate 12 by means of vacuum. During the movement of the plate 12 in a direction opposite to that of the direction of conveyance T, the film 2 is retained by means of a clamping mechanism, while at the same time air is blown out of the apertures 13 in the plate 12, so that the film 2 lies clear of the plate 12.

To prevent a loop from forming between the component placement device 5 and the oven 6 and to hold the film 2 tautly between the component placement device 5 and the oven 6, the step size S2 of the plate 12 may be equal to the step size S1 of the movement mechanism 11. Furthermore, the plate 12 and the movement mechanism 11 may be driven simultaneously, so that the plate 12 and the movement mechanism 11 are moved simultaneously in the direction of conveyance T.

The step size S1 is dependent upon the component placement device 5 and, therefore, depends, upon, for example, the number of component pick-up and placement nozzles of the component placement device 5 and the distance between the nozzles. A time t1 between each step is also determined by the component placement device 5. The time t1 should be as short as possible in order to permit placing of many components as possible on the film 2. Further, to heat the soldering compound sufficiently (by means of the heatable plate 12) such that the components will be properly adhered to the film 2, the film 2 should be provided on the heatable plate for a time t2. If, for example, the time t2 is 180 step-seconds, while the time t1 is 20 seconds, a certain part of the film should be held on the plate 12 for t2/t1=X steps, i.e., 180 step-sec/20 sec=9 steps. If the step size S1 (and, therefore, the step size S2) is 80 mm/step, the plate 12 should have a length L=(X steps)(S1), i.e., L=(9 steps)(80 mm/step)=720 mm, in order to ensure that every part of the film comes into contact with the plate 12 while it passes through the oven 6.

Figure 4:
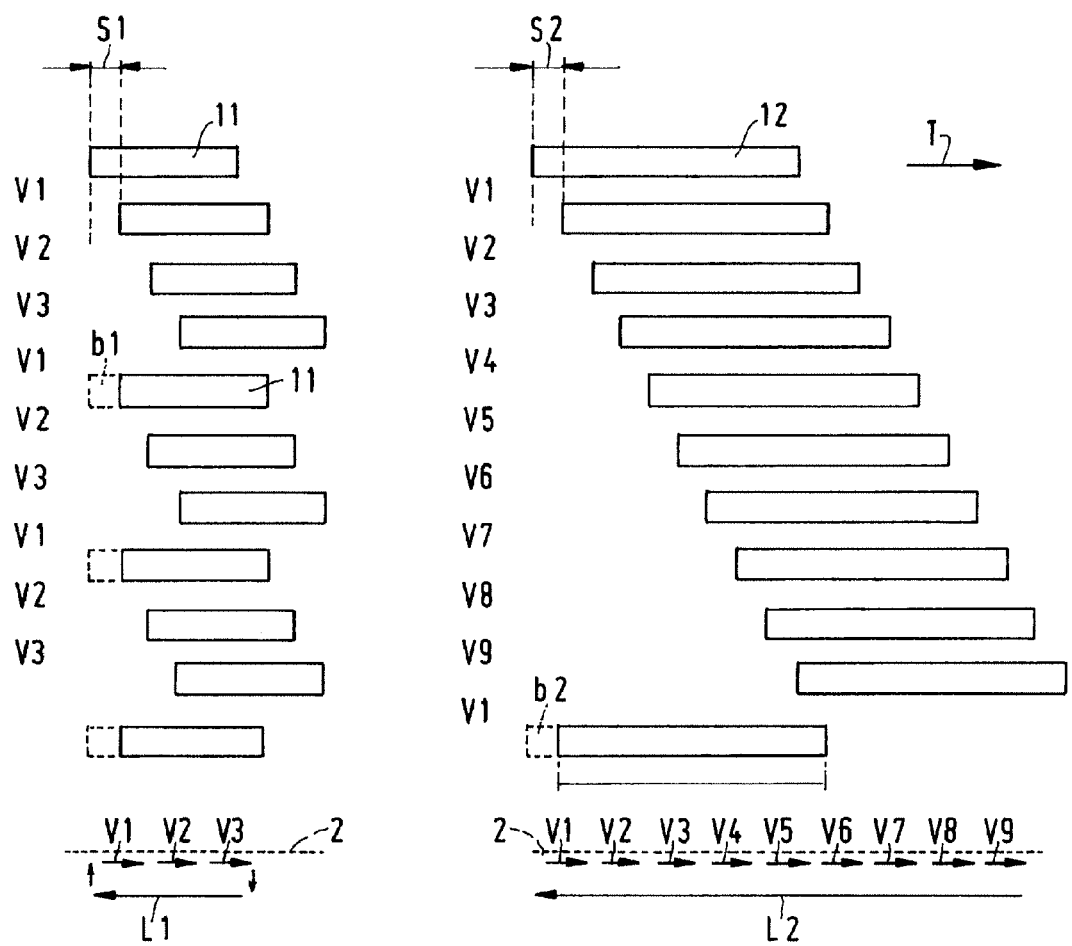
FIG. 4 schematically shows movement of the plate of FIG. 3 and of a movement mechanism of an oven of the device shown in FIG. 1.

FIG. 4 shows schematically the movement of the movement mechanism 11 and also the plate 12. During the steps V1, V2 and V3, the movement mechanism 11 and the plate 12 are both moved in the direction of conveyance T. After step V3 the movement mechanism 11 is returned to the starting position b1, after which the first step V1 is carried out by the movement mechanism 11. The plate 12 is moved further in the direction of conveyance T during the remaining steps V4-V9. After step V9, the plate 12 is moved in a direction opposite to that of the direction of conveyance T over a distance equal to the length L of the plate 12 to the starting position b2, after which the first step V1 is carried out by the plate 12. As is apparent from FIG. 4, the return distance L1 of the movement mechanism 11 is about one third of the return distance L2 of the plate 12.

To increase the residence time t2 of a particular part of the film 2 on the plate 12 at a given step size S1, S2 and a given length of time t1 between the various steps, the length L of the plate 12 as well as the number of steps during which the particular part of the film 2 remains on the plate 12 should be increased.

The temperature of the plate 12 can be controlled easily by means of an electric current passed through the plate 12, so that a desired heating and cooling curve of the film 2 can be achieved.

Figures 3, 5:
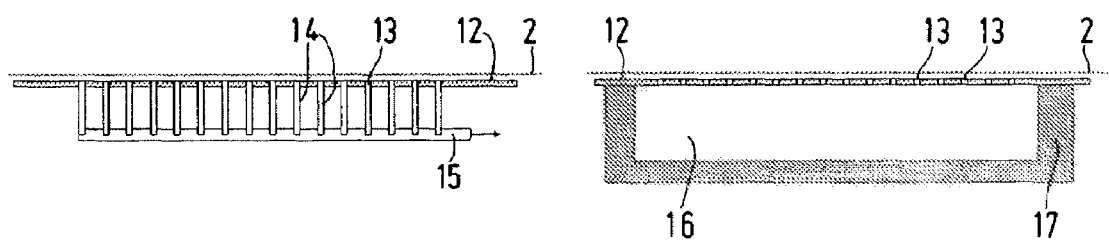
FIG. 3 shows a cross-section of a first embodiment of a heatable plate according to the present invention.
FIG. 5 shows a cross-section of a second embodiment of a heatable plate according to the present invention.

FIG. 5 shows a second embodiment of the heatable plate 12, which is provided with apertures 13. The plate 12 is situated above a chamber 17 bounding a space 16, which space 16 is connected to a vacuum source. Such a chamber 17 is relatively simple in construction. Means may be provided in the chamber 17 to prevent the heatable plate 12 from bending under the influence of the vacuum.

It is also possible to connect the movement mechanism 11 mechanically to the heatable plate 12. As a result, when the movement mechanism 11 moves, the plate 12 may automatically be moved at the same time and over the same distance.

It is also possible to provide additional heating means in the oven 6 by means of which the film 2 may be additionally heated from an upper side.

It is also possible to use a hardening adhesive in the same manner, instead of heating a soldering compound.

Accordingly, these other apparatuses and methods are fully within the scope of the claimed invention. Therefore, it should be understood that the apparatuses and methods described herein are illustrative only and are not limiting upon the scope of the invention, which is indicated by the following claims.

What is claimed is:

1. A method for heating a strip-shaped carrier in an oven, the method comprising the steps of:
   passing the carrier through the oven in a direction of conveyance, wherein the carrier is supported by a heat generating plate which is moved together with the carrier through the oven stepwise with a predetermined step size from a starting position to an end position;
   moving the carrier further in the direction of conveyance, while returning the heat generating plate to the starting position.

2. The method according to claim 1, further comprising the step of:
   drawing the carrier against the plate by means of vacuum.

3. The method according to claim 2, further comprising the steps of:
   placing components on the carrier with a component placement device that is situated upstream of the oven; and
   fixing the components on the carrier in the oven,
   wherein the component placement device is provided with a movement mechanism by means of which the carrier is moved through the component placement device stepwise with a predetermined step size.

4. The method according to claim 3, wherein the step size of the movement mechanism is equal to the step size of the plate.

5. The method according to claim 1, further comprising the steps of:
   placing components on the carrier with a component placement device that is situated upstream of the oven; and
   fixing the components on the carrier in the oven,
   wherein the component placement device is provided with a movement mechanism by means of which the carrier is moved through the component placement device stepwise with a predetermined step size.

6. The method according to claim 5, wherein the strip-shaped carrier extends through the component placement device and the oven, and wherein the carrier is moved simultaneously by the movement mechanism and the plate in the direction of conveyance.

7. The method according to claim 5, wherein the step size of the movement mechanism is equal to the step size of the plate.

8. A device comprising:
   an oven for heating a strip-shaped carrier, the oven comprising:
      a heat generating plate,
   wherein the carrier is configured to be moved through the oven in a direction of conveyance,
   wherein the heat generating plate is configured to be moved stepwise with a predetermined step size from a starting position to an end position in the direction of conveyance, and
   wherein after reaching the end position, the heat generating plate is configured to be returned to the starting position.

9. The device according to claim 8, wherein the plate is provided with at least one aperture connected to a vacuum source.

10. The device according to claim 9, wherein each of the apertures is connected to a corresponding pipe.

11. The device according to claim 9, wherein each of the apertures is connected to a common vacuum chamber.

12. The device according to claim 8, further comprising:
   a component placement device that is situated upstream of the oven, the component placement device comprising:
      a movement mechanism by means of which the carrier is configured to be moved stepwise with a predetermined step size through the component placement device.

13. The device according to claim 12, wherein the step size of the movement mechanism is equal to the step size of the plate.

14. The device according to claim 8, wherein a length of the plate in the direction of conveyance is at least equal to the step size by which the plate is moved in the direction of conveyance, multiplied by the number of steps in which the plate is moved from the starting position to the end position.

* * * * *